(12) United States Patent
Josso et al.

(10) Patent No.: US 7,760,035 B2
(45) Date of Patent: Jul. 20, 2010

(54) NOISE-GENERATING DEVICE AND METHOD

(75) Inventors: Bruno Josso, Juan les Pins (FR); Daniel Billet, Tourettes s/Loup (FR)

(73) Assignee: Thales (FR)

( * ) Notice: Subject to any disclaimer, the term of this patent is extended or adjusted under 35 U.S.C. 154(b) by 386 days.

(21) Appl. No.: 11/997,304

(22) PCT Filed: Jul. 3, 2006

(86) PCT No.: PCT/EP2006/063809

§ 371 (c)(1),
(2), (4) Date: Jan. 29, 2008

(87) PCT Pub. No.: WO2007/012544

PCT Pub. Date: Feb. 1, 2007

(65) Prior Publication Data

US 2008/0207113 A1      Aug. 28, 2008

(30) Foreign Application Priority Data

Jul. 29, 2005   (FR)   ................................. 05 08130

(51) Int. Cl.
*H03B 29/00* (2006.01)
(52) U.S. Cl. .................. 331/78; 375/140; 708/250; 708/271
(58) Field of Classification Search .............. 331/78; 708/250, 271; 375/140
See application file for complete search history.

(56) References Cited

U.S. PATENT DOCUMENTS

| 4,173,000 A | 10/1979 | Singer et al. |
| 4,375,620 A | 3/1983 | Singer et al. |
| 6,560,212 B1 | 5/2003 | Prasad et al. |
| 7,050,966 B2 * | 5/2006 | Schneider et al. ........ 704/200.1 |

* cited by examiner

*Primary Examiner*—Arnold Kinkead
(74) *Attorney, Agent, or Firm*—Lowe Hauptman Ham & Berner, LLP

(57) ABSTRACT

The invention relates to the field of devices intended to generate a noise of high amplitude having specific spectral characteristics. It concerns a transmission device mainly comprising a transducer, means for synthesizing a digital noise sequence x'(n) and power sources. According to the invention, the device also comprises means such that according to the value, at each time t, of the synthesized noise sequence, the transducer is supplied by one or more noise sources placed in series, the overall voltage reflecting the value of the digital noise sequence. The transition times between two supply values are synchronous with the basic clock of means which synthesize x'(n). The invention also relates to a method for iteratively synthesizing, under spectral constraint, a noise having a power spectral density corresponding to a given template. The invention applies in particular to the submarine acoustic noise generators on board small-size autonomous craft. It can also apply to the production of scramblers in mobile telephony.

8 Claims, 4 Drawing Sheets

4-a 4-b 4-c

NOISE-GENERATING DEVICE AND METHOD

CROSS-REFERENCE TO RELATED APPLICATIONS

The present Application is based on International Application No. PCT/EP06/063809 filed on Jul. 3, 2006, which in turn corresponds to French Application No. 05 08130 filed on Jul. 29, 2005, and priority is hereby claimed under 35 USC §119 based on these applications. Each of these applications are hereby incorporated by reference in their entirety into the present application.

BACKGROUND OF THE INVENTION

1. Field of the Invention

The present invention relates to the field of the generation of signals under constraints and more specifically the production of discretized signals with imposed spectrum for example for producing noise generators or scramblers. The invention relates in particular to the field of acoustic noise generators.

2. Prior Art

The qualities that are required of scramblers and in particular acoustic scramblers are, with a controlled volume and weight, to transmit a noise of imposed power spectral density (p.s.d.) with the greatest possible energy autonomy.

It is known from the prior art to proceed by associating with a driver synthesizing the signal to be transmitted, a power amplifier that supplies the electrical excitation at the same time as it achieves the electrical impedance matching of the transducer which transforms the electrical signal into an electromagnetic, optical, acoustic or other signal depending on the medium in which the scrambling or noise generation is performed.

The class of the power amplifier used (A, AB, B, C, D, E, F, . . . ) depends on the constraints of linearity, efficiency, maximum frequency, resolution, and so on, imposed operationally.

The use of conventional means in some cases poses serious problems. The transducers have complex, or reactive, frequency-dependent impedances that require adapters to be implemented after amplification that are themselves reactive—inductive or capacitive—possibly associated with magnetic transformers. These elements normally have a footprint and a weight that render their use prohibitive. Similarly, in certain particular applications, producing high power linear amplifiers with a wide dynamic range and wide bandwidth is not always compatible with the efficiency, weight and volume conditions imposed by certain applications.

To meet the requirements of efficiency and miniaturization of the linear power amplifiers, it is possible to produce a high amplitude electrical signal by placing in series a certain number of DC voltage sources of reasonable sizes and delivering voltages of suitable values. Each source delivers, via an appropriate switching system, a voltage that is generally constant to the duly produced series circuit. This way, under the action of a specific control, variable in time, applied to the corresponding switch, each source is placed in series with other sources which are also selected and the voltage V produced by this source is added to the voltages produced by the other sources so as to produce the required level.

In a simple embodiment, it is possible, for example, to use a single voltage source whose outputs can be switched so as to generate a signal in the form of a two-level coded sequence, having the power needed to excite a transducer. The switching actions can, for example, by controlled according to a binary sequence of maximum length, repeated to produce a white noise. This solution is very satisfactory with respect to the energy but does not make it possible to take account of the spectral constraints that are more often than not imposed in the noise generators, especially when their function is to deceive.

One way of proceeding is to start from an analog signal, synthesized by a pilot having the required characteristics, and to select sources by discretizing the signal from the pilot by as many levels as are needed to calculate the source switchover indicators. The product signal obtained is applied to the transducer, it has the desired power but is discretized and does therefore have exactly the same p.s.d. as the DC signal. There are many limitations to this method. To avoid distorting the p.s.d. of the signal caused by the discretization there is a trend towards multiplying the number of levels, that is, increasing the number of the voltage sources and therefore the weight and footprint. This also leads to an increase in the frequency of the level transitions which lowers the efficiency.

Methods other than this direct discretization are possible. One solution consists in applying a known synthesis method, of the "conversion with a small number of quantization bits (up to 1)" type, such as "Sigma-Delta" modulation for example. This solution, not expanded on here, is, however, rarely used to generate a noise having a determined spectrum. In principle, this type of synthesis solves the dynamic range problem. However, it favors, by the spectral configuration of the quantization noise intrinsic to its oversampled operation, the displacement of the energy of the quantization noise to the upper parts of the spectrum. A major filtering of this noise outside of the useful band is normally necessary, which radically reduces the benefit of this approach. One way of limiting these effects then consists in strongly increasing the sampling frequency of the system, a means which, for technological hardware or cost reasons, is not always usable.

Another way of producing the synthesis of the control signal consists in using a synthesis method based on the known principle of pulse width modulation. In this method, the transition instants are defined by the amplitude of the signal. The generation of out-band noise is limited and the accuracy of the coding is satisfactory. On the other hand, this synthesis method involves having a variable clock and therefore remains a solution that is relatively difficult to implement and, moreover, costly. It is possible to synchronize the transitions, but it is essential to choose, for the clock, a frequency that is much higher than the Shannon frequency: problems similar to those described previously then arise again.

SUMMARY OF THE INVENTION

One aim of the invention is to produce a noise transmitter of imposed p.s.d., which is lightweight and compact and highly efficient. To this end, a joint optimization of the three steps that are synthesis of the signal, production of the power and transduction, is sought.

To this end, the subject of the invention is a device for transmitting a discretized noise on at least two levels, comprising at least:
  a synthesizer for producing a sampled and quantized digital noise,
  a transducer linked to a power supply circuit,
  electrical power supply sources,
  switches for separately incorporating each source in the power supply circuit, the sources incorporated in the power supply circuit being placed in series with one another, control means for generating the control signal for each switch.

The device according to the invention has the following characteristics:

the synthesis means produce, by iterative digital synthesis under spectral constraint, a noise quantized on at least two levels and having a determined power spectral density, the control signal applied to each switch is generated by the control means according to the noise produced by the synthesizer, the control signal being synchronous with the basic clock of the synthesizer, a certain number of sources are placed in series, at a time t, with the terminals of the transducer to supply a voltage reflecting the value at that time of the digital noise produced by the synthesizer.

According to one characteristic of the device according to the invention, for each voltage value to be applied to the transducer, the control means produce a control signal which is a function of the value of the noise produced by the synthesizer and the characteristics of each of the available sources.

According to one particular embodiment, the transmission device according to the invention comprises L identical sources and control means suitable for managing the bringing into line of the sources according to the voltage to be applied at the time concerned and their state of charge or energy reserve in order to optimize the autonomy of the assembly.

According to one particular embodiment, the device according to the invention comprises at least:

a synthesizer for producing a discrete digital noise quantized on two levels, a transducer, an electrical power supply source, switching means for connecting the source to the terminals of the transducer, control means for actuating the switching means, In this particular embodiment, the synthesis means produce, by iterative digital synthesis under spectral constraint, a binary noise, having a determined power spectral density. The control signal applied to the switching means makes it possible to switch the source to the terminals of the transducer so as to apply to it a voltage V when the synthesized noise assumes one of the two states and a voltage −V when the noise assumes the other state.

Another subject of the invention is a method of synthesizing a digital noise sampled and quantized on at least two levels, having a spectral density conforming to a given template, characterized in that it comprises at least:

an initialization step during which the process is initialized using a sampled noise sequence $x_0(n)$ comprising N samples, and a mask filter represented by its impulse response $h(n)$.

a first computation step during which an $x_0(n)$ linear filtering operation is performed by the mask filter $h(n)$ and a nonlinear quantization operator $Q[.]$ is applied to the sequence $x_1(n)$ obtained after filtering so as to obtain a sequence $y_1(n)$ quantized according to the number of desired levels.

a second iterative step during which, on each iteration i, the following are performed:

the filtering of the sequence $y_{i-1}(n)$ by the mask filter $h(n)$ the quantization of the sequence $x_i(n)$ obtained by filtering $y_{i-1}(n)$ so as to obtain the quantized sequence $y_i(n)$, the second iterative step comprising the analysis of the power spectral density (p.s.d.) of the sequence $y_i$ and the test of a criterion of adequacy of this spectral density to the desired template, represented by $h(n)$.

a step for stopping the process, during which the method delivers a sequence $x'(n)$ equal to the sequence $y_i(n)$ on the last iteration carried out, this step being undertaken when, for a given iteration i, the adequacy criterion is satisfied.

According to one characteristic of the method according to the invention, the adequacy criterion, which can be chosen according to the application, is a criterion that is dependent on the mean quadratic distance d between the p.s.d. of the sequence $y_i(n)$ obtained on the iteration i and the modulus squared $\|H(f)\|^2$ of the frequency response of the mask filter $h(n)$.

According to another characteristic, the initialization sequence $x_0(n)$ is a sequence having the characteristics of a sampled white noise in the band of the mask filter $h(n)$.

According to another characteristic, the length of the noise sequence $x_0(n)$ is longer than the impulse response $h(n)$. The synthesis method can be repeated in time in a rolling manner provided that a few usual precautions are taken in processing the signal to ensure the continuity of the properties of the noise obtained.

The method according to the invention advantageously makes it possible to synthesize a discretized noise having a determined p.s.d., and such that the level changes are synchronous with a fixed clock of a frequency that is as low as possible according to the imposed spectral template.

The number and amplitudes of the discretization levels can advantageously be chosen so that, for a power device based on the serialization of DC sources, the characteristics of the sources can be taken into account in order to optimize their use in the target application.

Finally, since this method supplies a digital noise of p.s.d. conforming to a template, it is advantageously possible to correct the defects of the response of the transducer and of the complete transmission chain to obtain the desired p.s.d. at the transduction stage output.

Since the method making it possible to synthesize the noise to be transmitted is iterative, it is initialized by a noise sequence, which is filtered by a filter having the imposed template; at the output of this filter, the signal is discretized. This double filtering and discretization operation is repeated until a satisfactory proximity between the p.s.d. of the discretized noise and the imposed spectral template is obtained. This proximity is tested on each iteration in the sense of a criterion C chosen according to the application.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

DESCRIPTION OF THE FIGURES

The present invention is illustrated by way of example, and not by limitation, in the figures of the accompanying drawings, wherein elements having the same reference numeral designations represent like elements throughout and wherein.

DETAILED DESCRIPTION

Figure 1:
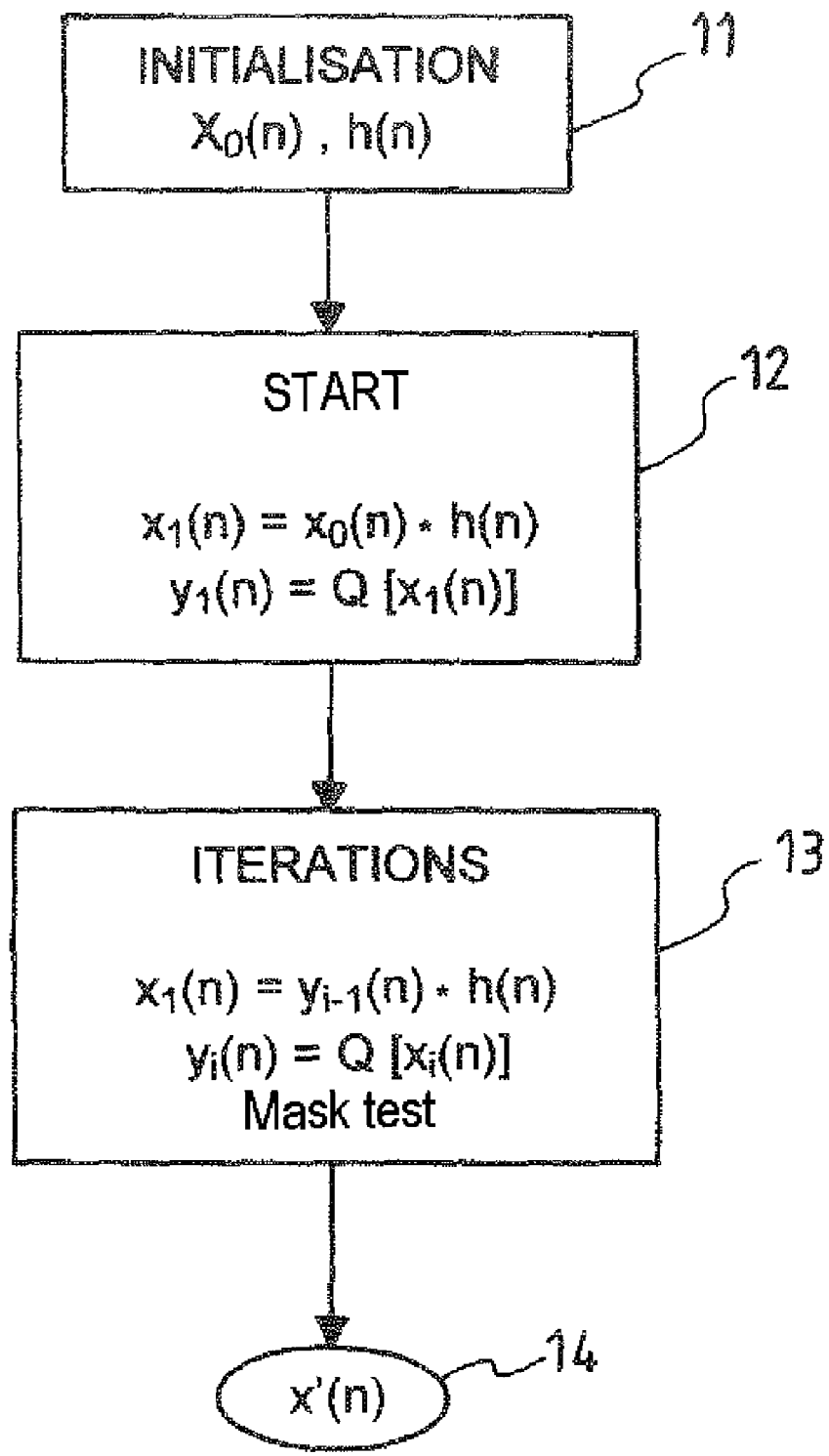
FIG. 1, a theoretical flow diagram of the method according to the invention, of constrained digital generation of a noise having a determined p.s.d. and an amplitude that varies over time according to a number of quantized states, FIG. 2, the theoretical diagram of a transmitter device according to the invention, making it possible to transmit a discretized acoustic noise generated from the digital noise synthesized using the method according to the invention, FIG. 3, the theoretical diagram of a device making it possible to transmit an acoustic noise generated from the digital noise synthesized using a two-level quantization.

The process according to the invention, illustrated by FIG. 1, makes it possible to produce constrained digital synthesis of a quantized noise having specific spectral characteristics. This synthesized noise takes the form of a sequence comprising N samples that can take only K amplitude values, clocked by a clock of period $T_e=1/F_e$ ($F_e$ being the frequency of the clock).

The general function produced by the method consists in producing, from a noise sequence, a noise sequence whose power spectral density (p.s.d.) follows a determined template. This template can be represented by the modulus of the frequency response $H(f)$ of a given filter.

As illustrated in FIG. 1 the method according to the invention comprises several steps.

Initialization of the Process

During this step marked 11 in FIG. 1, the method is initialized using a sampled noise sequence $x_0(n)$ comprising N samples, and a mask filter represented by its impulse response $h(n)$. Its frequency response $H(f)$ has a modulus squared, $\|H(f)\|^2$, which corresponds to the template of the p.s.d. of the desired noise.

According to a variant of embodiment of the method according to the invention, the sequence $x_0(n)$ is a sequence corresponding to a white noise in the band covered by the filter $h(n)$, the use of the filter thus making it possible to obtain a "colored" noise.

Input to the Computation Loop

This step 12, like the following iterations, comprises two operations: the first operation is an $x_0(n)$ linear digital filtering operation by the mask filter $h(n)$. This digital filtering operation is, for example, performed by Fourier transform, or by circular convolution, expressed by the following relation:

$$x_1(n)=x_0(n)*h(n) \qquad [1]$$

The second operation consists in applying a nonlinear quantization operator $Q[.]$ to the sequence $x_1(n)$ obtained after filtering. The sequence $y_1(n)$ obtained after quantization has the general expression $$y_1(n)=Q[x_1(n)] \qquad [2]$$

The quantization operation is performed using an appropriate operator $Q[.]$.

In the case where the sequence processed is a binary sequence with two levels 0 and 1, this operator can, for example, be defined using the "sign" function, denoted Sign [.], by the following relation:

$$Q[\cdot] = \frac{\text{Sign}[\cdot]+1}{2} \qquad [3]$$

The only difference between this first loop and the subsequent loops is that the initial signal $x_0(n)$ to which the filtering is applied is not quantized on K levels by the operator $Q[.]$ as are subsequently the signals named y to distinguish them.

Iterative Phase

During this step 13 of iterations, the filtering and quantization operations described in step 1 are performed iteratively. On each iteration i, the filtering operation is applied to the sequence $y_{i-1}(n)$ obtained by quantization on the iteration i−1. This $y_{i-1}(n)$ filtering operation produces the filtered sequence $x_i(n)$ to which is applied the quantization operation so as to obtain the sequence $y_i(n)$.

During this step for a given iteration i, it is possible to write the following relations:

$$x_i(n)=y_{i-1}(n)*h(n) \qquad [4]$$

$$y_i(n)=Q[x_i(n)] \qquad [5]$$

Thus, for the iteration of rank 2, we have, for example:

$$x_2(n)=y_1(n)*h(n) \text{ and } y_2(n)=Q[x_2(n)]$$

If, on the other hand, we develop all the operations in the step i by working back to the original pseudo-white noise $x_0(n)$, we then obtain the following relation which characterizes the method according to the invention:

$$y_i(n) = \underbrace{Q[\ldots Q[Q[Q[x_0(n)}_{i \text{ Quantizations}} * \underbrace{h(n)]*h(n)]*h(n)]\ldots *h(n)]}_{i \text{ convolutions}}$$

At the end of each of the iterations, operations are performed to measure the distance separating the p.s.d. of the quantized signal $y_i(n)$ and the spectrum of the mask filter $h(n)$. This distance is considered as an error which must be minimized. The similarity of the p.s.d. with the chosen template is thus tested on each iteration in the sense of a criterion C which is itself chosen according to the application.

The iterative step is interrupted when a stop criterion is satisfied. This criterion can take various forms, which will be, for example, the transition below a threshold of a mean quadratic distance between the template and the p.s.d. of the signal $y_i(n)$.

The method then supplies the load with a digital output sequence x'(n) 14, sampled at the frequency $F_e=1/T_e$. The sequence x'(n) corresponds to the sequence $y_i(n)$ obtained in the last iteration performed.

It should be noted that, as during the iterative phase, the method according to the invention can proceed, at the end of the phase for input to the computation loop, with operations aiming to measure the distance separating the p.s.d. of the quantized signal $y_i(n)$ and the spectrum of the mask filter $h(n)$. If the stop criterion C is satisfied, the method is interrupted at this stage and the signal x'(n)=$y_1(n)$ is then delivered.

The method according to the invention presents the advantage of making it possible to simply obtain a signal quantized and sampled according to a predetermined number of levels and with level variations over time that are synchronous with the basic clock Te.

The duly produced signal can, furthermore, be advantageously configured to be used to control the application of simple, small and high efficiency devices, making it possible to generate a high amplitude electrical signal, intended to excite a transducer, an acoustic transducer for example, so that it transmits a wave having the desired characteristics.

The advantageous characteristic of the method, which makes it possible by respecting the spectral constraints to produce level changes synchronous with a clock, limits the switching losses which would be produced if there were a rapid succession of level changes.

The method making it possible to synthesize the noise to be transmitted is iterative; it is initialized by a noise sequence, which is filtered by a filter having the imposed template; at the output of this filter the signal is discretized. This double filtering and discretization operation is reiterated until a satisfactory proximity between the p.s.d. of the discretized noise and the imposed spectral template is obtained; this proximity is tested on each iteration in the sense of a criterion C chosen according to the application.

According to a preferred embodiment, the criterion C is based on the measurement of the mean quadratic distance d between the p.s.d. of the discretized noise and the modulus squared of the frequency response of the mask filter.

The method according to the invention thus makes it possible to create a noise sequence of finite length that can be repeated so as to obtain the transmission of a noise of desired duration. According to a preferred embodiment, the white noise sequence $x_0(n)$ used in the initialization step is substantially longer than the impulse response of the mask filter. The synthesis method can be repeated in time in a rolling manner; at the end of the $x_0(n)$ filtering sequence, an overlap between the preceding initialization sequence $x_0(n)$ and the new initialization sequence substantially equal to the carrier of the percussive response of the mask filter so as to ensure the continuity of the sequence created by avoiding transients according to known signal processing techniques.

Figure 2:
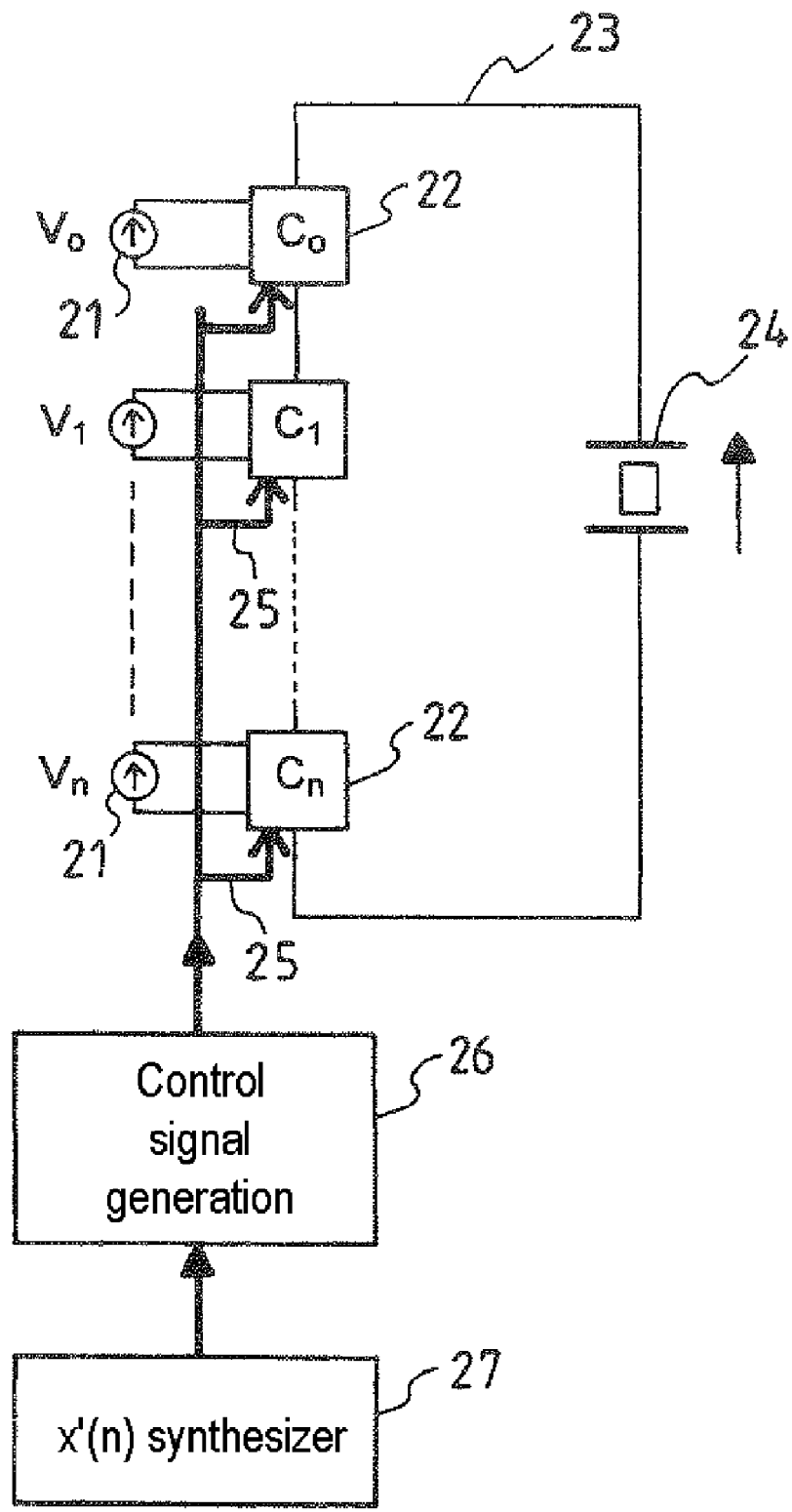

Reference is now made to FIG. 2 which presents the theoretical diagram of the power device according to the invention, making it possible to excite a transducer to transmit a discretized analog noise (on K amplitude levels) which is, in signal processing terms, the zero order interpolated signal of the noise sequence sampled and quantized (on K levels) obtained at the output of the iterative process described previously. As can be seen in FIG. 2, such a device has a very simple structure consisting of voltage sources 21 ($v_0 \ldots v_n$) not referenced to one another and whose values are identical or different depending on the application envisaged, in particular according to the chosen quantization levels.

The use of identical sources presents the advantage of enabling an intelligent management of sources such as button cell or other batteries used by ensuring a balanced use, and therefore discharge, of these sources which, inasmuch as they are identical, are interchangeable. This management mode is particularly advantageous for the transmission devices fitted on autonomous vehicles and for all the systems having autonomy constraints. The use of sources having different levels makes it possible to multiply the discretization levels of the signal without in any way multiplying the number of sources, which can offer an advantage in terms of weight and footprint. Thus, with two sources V1 and V2, it is possible to produce V1, V2, V2−V1, V1+V2, −V1, −V2, V1−V2, −V1−V2.

It is also possible to modify the basic structure of FIG. 2 so as to form a device that is somewhat more complex, not illustrated, made up of intermediate sources, consisting of button cell or other batteries for example, supplying the necessary power under the best voltage and current conditions to produce the excitation of the transducer 24, these sources being followed by a chopping device intended to raise the voltage supplied to the level needed for the transducer. A degree of freedom is thus introduced which makes it possible to optimize the discharging of the button cell or other batteries to take account of their capacity characteristics. Depending on the desired configuration, the chopping device can be installed behind the source serialization circuit. This device can even be made up of a set of chopping devices, one device being placed at the terminals of each source before the serialization circuit.

Whatever the type of embodiment envisaged for the device according to the invention, the voltage sources $v_0 \ldots v_n$ used are incorporated in the series circuit 23 via switching elements 21. The terminals of the circuit 23 are linked to the electrodes of the transducer 24.

Each of the voltage sources 21 is associated with a switching device 22, the function of which is to enable or not the integration of the source into the series power supply circuit 23 of the transducer 24. Each switching device 22 is controlled by a signal 25 generated by synthesis means 26. During the time, each command takes a value that is a function of the signal x'(n) synthesized by the method according to the invention illustrated by FIG. 1, and synchronous with the latter. The set of control signals constitutes a time sequence defined in such a way that the signal applied by the series circuit to the transducer constitutes a discretized signal whose power spectral density conforms to the defined template.

Figure 3:
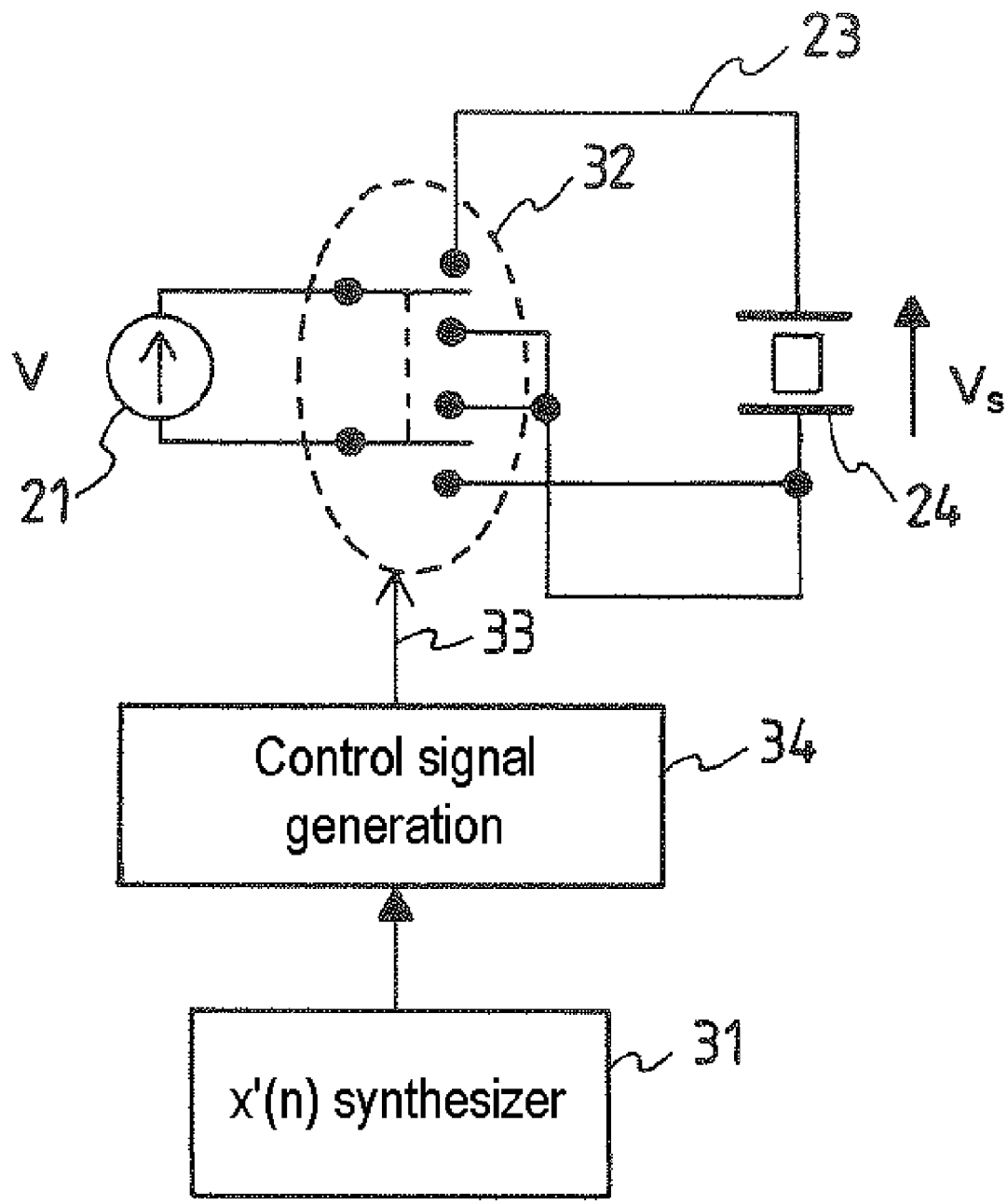

In a simple embodiment, given by way of example and illustrated by FIG. 3, the device according to the invention can consist of a single voltage source 21 associated with an inverter device 32 making it possible to apply to the transducer either a voltage +V or a voltage −V. In this simple example, the control signal 31 applied to the inverter can be directly a signal x'(n) coded on one bit and synthesized by the method described previously.

Figure 4:
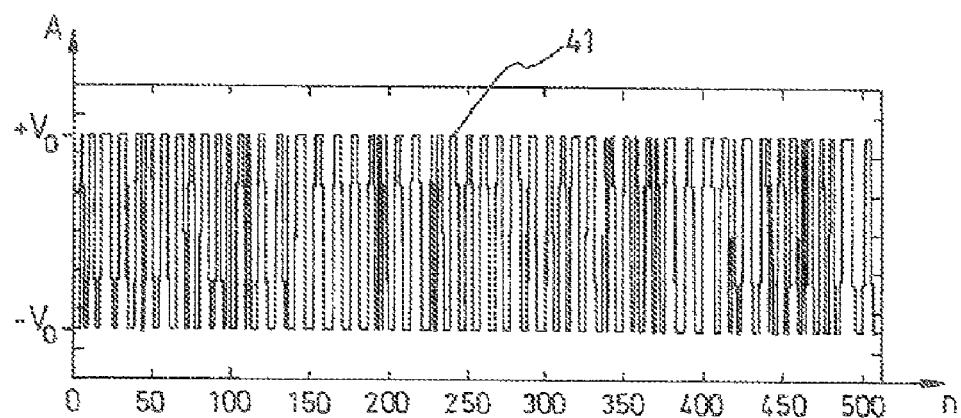
FIG. 4, the temporal and spectral representations of the signal obtained by the method according to the invention, in the case where a two-level quantization is applied.
Figure 4:
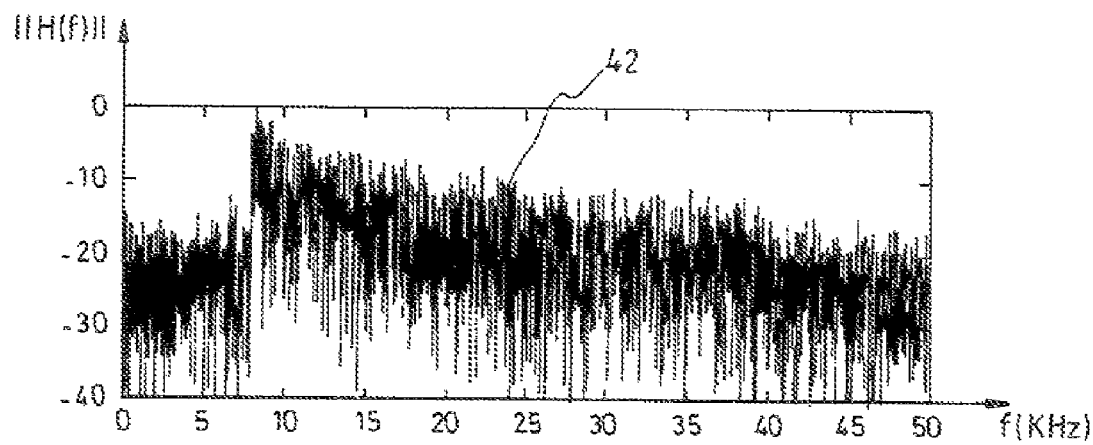
Figure 4:
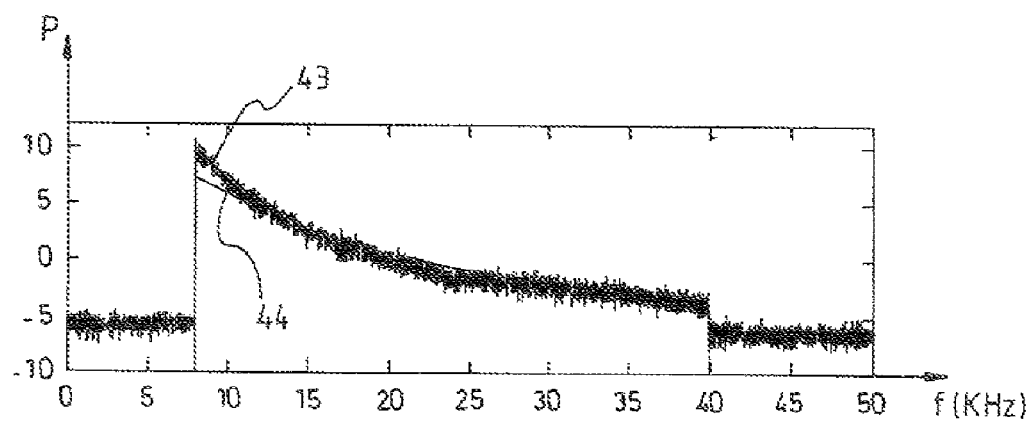

Reference is now made to FIG. 4 which illustrates one exemplary embodiment of the method according to the invention. In this example, the synthesized noise is a colored noise simulating sea noise whose power spectral density roughly follows a −17 log(f) law between 8 kHz and 40 kHz. The filter used here has a zero amplitude transfer function H(f) for the frequencies below 8 kHz and above 40 kHz, and whose amplitude follows a −17 log(f) variation law between 8 Hz and 40 kHz. The noise is furthermore synthesized in the form of a sequence of 512 time samples x'(n) coded on two states (coding on 1 bit). The sequence is clocked by a single clock with constant interval Te.

FIG. 4-a represents the curve 41 of amplitude variation of a series x'(n) of 512 samples obtained after applying the method according to the invention. The signal x'(n) thus takes the form of a simple binary sequence, each sample being able to take only one of the two alternative values $-V_0$ or $V_0$.

FIG. 4-b represents the curve 42 of power spectral density of the signal x'(n) obtained by the method according to the invention.

FIG. 4-c simultaneously represents the average value 43 of the spectrum of x'(n) represented by the curve in FIG. 4-b and the modulus 44 of the transfer function of the filter H(f). It shows that the method according to the invention makes it possible to simply restore a signal having a given frequency template, a sea noise in this case, from a simple binary sequence, the series x'(n) then consisting of samples coded on 1 bit (two levels). The spectral density obtained roughly follows the desired template with a trend slope in the useful band roughly equal to −17 log(f).

The exemplary implementation illustrated by FIG. 4 makes it possible to check that the method according to the invention can be used to obtain the desired signal at low cost. In practice, the amplification of a signal consisting of a binary sequence requires only the use of a DC voltage source V and a switching device making it possible to apply to the transducer, according to the state of the bit forming the signal x'(n), a voltage equal either to +V or to −V.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A device for transmitting a discretized noise on at least two levels, comprising:
    a synthesizer for producing a sampled and quantized digital noise,
    a transducer linked to a power supply circuit,
    electrical power supply sources,
    switches for separately incorporating each source in the power supply circuit, the sources incorporated in the power supply circuit being placed in series with one another,
    control means for generating control signals for each switch, in which:
        the synthesizer produces, by iterative digital synthesis under spectral constraint, a discretized noise sequence x'(n) having a determined power spectral density,
        control means apply to each switch a control signal according to the said noise sequence x'(n) produced by the synthesizer, said control signal being synchronous with the basic clock of the synthesizer,
        a certain number of sources being placed in series, at a time t, with the terminals of the transducer, this number being a function of the value at this time of the noise sequence produced by the synthesizer.

2. The transmission device as claimed in claim 1, in which, for each voltage value to be applied to the transducer, the control means produce a control signal which is a function of the value of the noise produced by the synthesizer and of the characteristics of each of the available sources.

3. The transmission device as claimed in claim 1, comprising L identical sources and control means suitable for managing the enabling of each source according to the voltage to be applied at the time concerned and the usage rate of each source at that time.

4. A device for transmitting a discretized noise, comprising:
    a synthesizer for producing a discretized digital noise,
    a transducer,
    an electrical power supply source,
    switching means for connecting the source to the terminals of the transducer,
    control means for actuating the switching means, wherein:
        the synthesizer producing, by iterative digital synthesis under spectral constraint, a binary noise sequence x'(n), discretized on two states, having a determined power spectral density,
        a control signal applied to the switching means by the control means makes it possible to switch the source to the terminals of the transducer so as to apply to it a voltage V when the synthesized noise assumes one of the two states and a voltage V when the noise assumes the other state.

5. A method for synthesizing a digital noise sequence quantized on K levels x'(n), having a spectral density conforming to a given template comprising the steps of:
    an initialization step during which the process is initialized using a sampled noise sequence $x_0(n)$ comprising N samples, and a mask filter represented by its impulse response h(n),
    a first computation step during which an $x_0(n)$ linear filtering operation is performed by the mask filter h(n) and a nonlinear quantization operator Q[.] is applied to the sequence $x_1(n)$ obtained after filtering so as to obtain a quantized sequence $y_1(n)$,
    a second iterative step during which, on each iteration i, the following are performed:
        the filtering of the sequence $y_{i-1}(n)$ by the mask filter h(n)
        the quantization of the sequence $x_i(n)$ obtained by filtering $y_{i-1}$, (n) so as to obtain the quantized sequence $y_i(n)$,
    the second iterative step comprising the analysis of the power spectral density (p.s.d.) of the sequence $y_i$ obtained and the test of a criterion of adequacy of this spectral density to the desired template, represented by h(n),
    a step for stopping the process, during which the method delivers a sequence x'(n) equal to the sequence $y_i(n)$ obtained on the last iteration carried out, this step being undertaken when, for a given iteration i, the adequacy criterion is satisfied.

6. The method as claimed in claim 5, in which the adequacy criterion is a criterion dependent on the mean quadratic distance d between the p.s.d. of the sequence $y_i(n)$ obtained on the iteration i and the modulus squared $\|H(f)\|^2$ of the frequency response of the mask filter.

7. The method as claimed in claim 5, in which the initialization sequence $x_0(n)$ is a sequence having the characteristics of a sampled white noise in the band of the mask filter h(n).

8. The method as claimed in claim 5, in which the length of the noise sequence $x_0(n)$ is longer than the impulse response h(n), the synthesis method being able to be repeated in time in a rolling manner, with, at the end of the sequence $x_0(n)$, an overlap between the preceding initialization sequence and the new initialization sequence that is roughly equal to the carrier of percussive response of the mask filter so as to ensure the continuity of the sequence created by avoiding transients.

* * * * *